(12) United States Patent
Ulichney et al.

(10) Patent No.: US 8,797,193 B2
(45) Date of Patent: Aug. 5, 2014

(54) PARALLEL TEST PAYLOAD

(75) Inventors: Robert Alan Ulichney, Stow, MA (US); Steven J. Simske, Fort Collins, CO (US); Matthew D. Gaubatz, Ithaca, NY (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/384,951

(22) PCT Filed: Jan. 29, 2010

(86) PCT No.: PCT/US2010/022541
§ 371 (c)(1),
(2), (4) Date: Jan. 19, 2012

(87) PCT Pub. No.: WO2011/093870
PCT Pub. Date: Aug. 4, 2011

(65) Prior Publication Data
US 2012/0281920 A1  Nov. 8, 2012

(51) Int. Cl.
*H03M 7/40* (2006.01)
*H03M 7/30* (2006.01)

(52) U.S. Cl.
CPC .......... *H03M 7/3093* (2013.01); *H03M 7/3095* (2013.01); *H03M 7/40* (2013.01)
USPC ................ 341/67; 341/51; 341/65; 341/95

(58) Field of Classification Search
CPC .......... H03M 7/40; H03M 5/145; H03M 7/00
USPC .......................... 341/56, 59, 65, 67
See application file for complete search history.

(56) References Cited

U.S. PATENT DOCUMENTS

| | | | | |
|---|---|---|---|---|
| 4,536,742 | A * | 8/1985 | Schouhamer Immink | 341/67 |
| 5,729,224 | A * | 3/1998 | Hirayama et al. | 341/59 |
| 5,748,763 | A | 5/1998 | Rhoads | |
| 5,901,117 | A * | 5/1999 | Delabre | 368/276 |
| 6,842,124 | B2 * | 1/2005 | Penna | 341/67 |
| 6,859,151 | B2 * | 2/2005 | He et al. | 341/50 |
| 6,867,715 | B2 * | 3/2005 | Sane et al. | 341/67 |
| 6,927,707 | B2 * | 8/2005 | Nguyen et al. | 341/67 |
| 6,958,713 | B2 * | 10/2005 | Nakagawa et al. | 341/58 |
| 7,242,719 | B2 * | 7/2007 | Meulenbroeks | 375/253 |
| 8,508,389 | B2 * | 8/2013 | McCanne et al. | 341/51 |
| 2001/0050623 | A1 | 12/2001 | Kahlman | |
| 2002/0186152 | A1 * | 12/2002 | Maeda et al. | 341/58 |
| 2003/0128140 | A1 * | 7/2003 | Xie et al. | 341/107 |
| 2008/0151938 | A1 | 6/2008 | Yang et al. | |
| 2011/0069328 | A1 | 3/2011 | Ulichney et al. | |
| 2011/0267207 | A1 * | 11/2011 | McCanne et al. | 341/59 |
| 2012/0306669 | A1 * | 12/2012 | Suzuki et al. | 341/67 |

FOREIGN PATENT DOCUMENTS

| | | |
|---|---|---|
| EP | 0981113 A2 | 2/2000 |
| WO | WO9403988 | 2/1994 |

OTHER PUBLICATIONS

International Search Report and Written Opinion for PCT/US2010/022541 dated Sep. 30, 2010 (8 pages).

* cited by examiner

*Primary Examiner* — Linh Nguyen (57) ABSTRACT

A parallel test payload includes a bit sequence configured to be segmented into a plurality of sub-sequences having variable bit length carriers. Respective carriers are represented uniformly in each one of the plurality of sub-sequences.

16 Claims, 5 Drawing Sheets

SHIFT POSITIONS FOR 1-BIT CARRIERS:

SHIFT POSITIONS FOR 2-BIT CARRIERS:

SHIFT POSITIONS FOR 3-BIT CARRIERS:

PARALLEL TEST PAYLOAD

BACKGROUND

The present disclosure relates generally to parallel test payloads.

Digital information is often encoded in analog carriers on data-bearing media, such as magnetic oxide particles (e.g., on a magnetic strip), electromagnetic signals, optically readable symbols created by physical etchings (e.g., on a digital video disk (DVD)), or ink (e.g., on paper). The rate of correct recovery for digital information encoded in analog carriers is variable and depends upon a variety of factors. For example, small variations in individual implementation for a given class of systems with a particular analog carrier can alter the recovery rate.

BRIEF DESCRIPTION OF THE DRAWINGS

Features and advantages of examples of embodiments of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Embodiments of the test payload disclosed herein include codes that are uniformly represented in each variable bit length. Such payloads may be used to test an analog carrier for all bit length codes in parallel. As such, the test payload described herein circumvents the need to perform separate procedures for each possible bit length in order to uniformly measure all possible codes. Furthermore, the system disclosed herein compares all possible codes in a multi-bit encoding population simultaneously (and with equal frequency). The payload blocks (i.e., the various sub-sequences) have variable bit densities but are all tested together. Using the single test payload disclosed herein enables relatively simple parallel calibration and implementation of systems with variable bit length codes.

Figure 1:
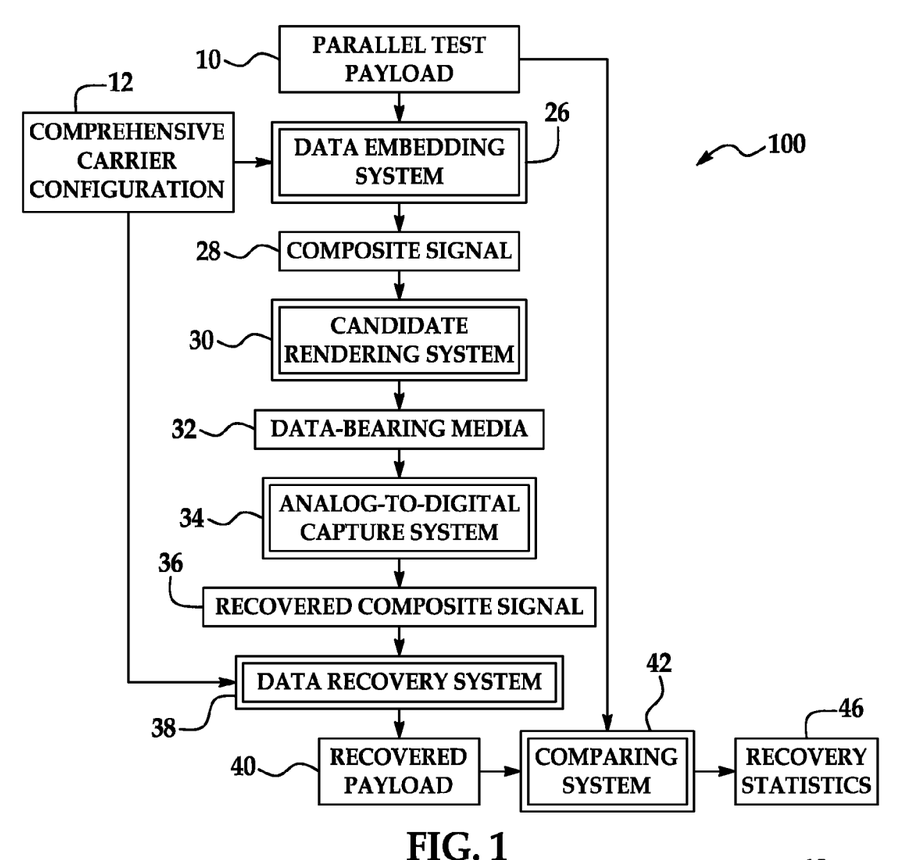
FIG. 1 is a schematic diagram depicting an example of a system for performing an example of a parallel calibration method.

An embodiment of a system 100 for performing an embodiment of a parallel calibration method is illustrated in FIG. 1. Very generally, the system 100 includes various sub-systems and/or components (each of which will be described further herein) configured for performing one or more of the method steps. The overall system 100 may include a network of interconnected computers and/or other electronic devices (e.g., scanners, printers, etc.), including virtualized and/or redundant processors, banks of processors and/or servers, etc. It is to be understood that the components of the system 100 may be implemented in a consolidated location, or portion(s) of the system 100 may be implemented at different locations.

The hardware of at least some of the sub-systems includes an electronic processing device, such as, for example, a controller, a micro controller, a microprocessor, a host processor, an application specific integrated circuit (ASIC), and/or a reprogrammable hardware logic device (such as a field programmable gate array (FPGA)). It is to be understood that the electronic processing device may be a processor working in conjunction with a central processing unit (CPU) performing the function of a general-purpose processor. Computer program(s) and/or software (e.g., computer readable code) may be loaded onto one or more of the sub-systems, and stored in a memory thereof. Such programs and/or software are executable via a processing device.

The system 100 shown in FIG. 1 utilizes a parallel test payload 10 and a comprehensive carrier configuration 12 to characterize a candidate rendering system 30 (i.e., a digital to analog converter that receives an input signal and renders it in some form on data-bearing media) by acquiring recovery statistics for each type of carrier tested. The recovery statistics may be used in an encoding system that is tailored for the candidate rendering system 30. For example, a low recovery rate for a particular carrier will affect how that carrier would be used to encode data for the particular candidate rendering system 30. As such, it is desirable to test carriers and candidate rendering systems 30 prior to encoding.

Analog carriers may be variable bit data carriers that are capable of being encoded with data sequences having different code bit lengths. In some instances, analog carriers are physical data carriers. The recovery statistics for carriers with particular bit-length capacities may vary with the code value (i.e., the actual bit information used in the particular code). To reliably assess the carrier, each code within the analog carrier should be tested the same number of times. This may be accomplished using the parallel test payload 10 and a comprehensive carrier configuration 12 described herein. In particular, the parallel test payload 10 has the unique property of enabling the code of each bit-length carrier to be tested the same number of times.

As used herein, the phrases "parallel test payload" and "uniform test payload" refer to a bit sequence (a sequence of bits is also referred to herein as a code) that can be segmented into a plurality of sub-sequences having variable bit lengths such that the carriers of the bit sequence are represented uniformly in each one of the sub-sequences. The bit sequence may be generated by a computer (not shown) configured with suitable sequence generating algorithms or software that yield the desired data and data format. The segmenting of the bit sequence may be accomplished manually (e.g., by a user of the system 100) or via suitable sequence segmenting algorithms or software that can divide the particular bit sequence into one or more sub-sequences, each of which includes multiple uniformly represented carriers, each of a predetermined bit length.

The phrase "bit length", as used herein, refers to the number of bits that are present in each carrier of a sub-sequence, and the phrase "variable bit length" means that each sub-sequence has a different number of bits per carrier. For example, a bit sequence may be segmented into a first sub-sequence having 1-bit carriers, a second sub-sequence having 2-bit carriers, and a third sub-sequence having 3-bit carriers, etc. It is to be understood that the bit lengths may be any desirable integer, and in one non-limiting example, the maximum bit length is 5 bits per carrier. "Parallel variable bit length" simply means that number of bits in the carriers of each sub-sequence descends in numerical order from one sub-sequence to the next (e.g., 5-bit carriers, 4-bit carriers, 3-bit carriers, 2-bit carriers, and 1-bit carriers).

Generally, for variable bit lengths ranging from 1 bit to b bits, the shortest test payload 10 that can have a uniform representation of all carriers in all sub-sequences includes a bit length, p, calculated according to the following formula:

$$p = \text{LCM}\{b2^b, (b-1)2^{b-1}, \ldots, 1\}$$

where LCM{ } is the "least common multiple". The values of p for the first few values of b are shown in Table 1.

TABLE 1

| b | p |
|---|---|
| 1 | 2 |
| 2 | 8 |
| 3 | 24 |
| 4 | 192 |

Figure 2:
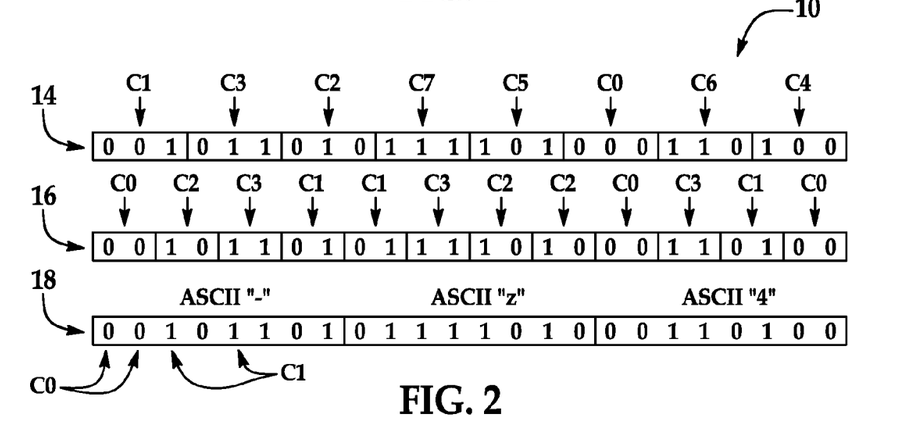
FIG. 2 is an example of a parallel test payload.

Referring briefly to FIG. 2, a non-limiting example of a test payload 10 having b=3 is depicted. The un-segmented 24-bit sequence or code is "001011010111101000110100". As illustrated in FIG. 2, the first sub-sequence 14 is segmented into 3-bit carriers such that each of the eight carriers (labeled C0, C1 . . . C7) is three bits long and is represented in the sub-sequence one time; the second sub-sequence 16 is segmented into 2-bit carriers such that each of four different carriers (labeled C0, C1 . . . C3) is two bits long and is represented in the sub-sequence three times; and the third sub-sequence 18 is segmented into 1-bit carriers such that each carriers (labeled C0 or C1) is one bit long and is represented in the sub-sequence equally (i.e., sub-sequence 18 contains an equal number of both 1's and 0's). As illustrated, the bits in the original bit sequence are not repositioned in the sub-sequences 14, 16, 18 but rather the bit lengths are redefined so that the carriers are different, but equally represented, in each sub-sequence 14, 16, 18.

In order for the bit sequence to be considered a parallel test payload 10, the carrier uniformity condition exists, respectively, for each sub-sequence 14, 16, 18 generated. As such, when b=5, an equal number of respective carriers is present in each of the sub-sequences (i.e., 5-bit length, 4-bit length, 3-bit length, 2-bit length, 1-bit length). It is to be understood that if carrier uniformity is met for all multiple-bit lengths (i.e., 2 or more), then the 1-bit length will also be satisfied. It is to be further understood that not all bit sequences will satisfy the sub-sequence carrier uniformity condition, and thus not all bit-sequences can be used as parallel test payloads 10.

In some instances, it may be desirable that the bit sequence of the parallel test payload 10 is presentable as a 3-byte printable ASCII sequence. For 3-bit variable carriers, there are 304 ASCII sequences that satisfy the conditions for uniformity, and such sequences are listed in numeral order in Table 2.

TABLE 2

| !9~ | +A{ | /u( | <)^ | Lho | Z0o | g/` | w'" |
|---|---|---|---|---|---|---|---|
| !?f | +F= | /yB | <e+ | Lj\| | Z2= | hC~ | w(9 |
| !g/ | +Gx | 0gz | <gb | Lk9 | Z3x | hLo | w(x |

TABLE 2-continued

| !oc | +OX | 0oZ | =F. | Lnl | Z?H | hON | w.! |
|---|---|---|---|---|---|---|---|
| !w. | +Q; | 1f/ | =a+ | Lo) | \8n | hS> | w.` |
| !}+ | +V< | 1v. | =f, | Lxn | \c+ | hc= | wB: |
| '"w | +W8 | 3V: | =g( | NR> | ^0n | hc\| | wr" |
| "-_ | +qc | 4g: | >! | N`o | ^:1 | hoL | x#g |
| "5~ | +w` | 5>& | >&5 | Nb= | `:p | h{1 | x({ |
| "?V | +yC | 5h; | >'F | Ncx | `<) | h\|l | x)O |
| "oS | ,)w | 5n# | >-X | NoH | ^<h | jsp | x/a |
| "wr | ,-g | 6&7 | >V2 | Npn | _8) | k@o | xCz |
| #'g | ,Mz | 6d; | >gB | Nz1 | _8h | kB= | xOJ |
| #)_ | ,]: | 6v2 | ?&% | Nzp | _:! | kCx | xS: |
| #Gz | ,e/ | 7&' | ?)X | N\|) | _:` | kOH | Xsb |
| #OZ | ,u. | 7F: | ?V" | N\|h | _B+ | kR< | yB/ |
| #W: | ,yr | 7v" | B:w | OJ9 | ac/ | kS8 | yr, |
| #u+ | ,}b | 8'g | Bc{ | OJx | as. | kpl | ys( |
| #wb | -J7 | 8)_ | BoK | ON) | b#w | ks` | z!O |
| (9w | -X> | 8Gz | Bzs | ONh | b,} | p*w | z#G |
| (=g | -a/ | 8OZ | B\|k | Ox) | b-O | pcz | z/A |
| (G~ | -h= | 8W: | C:g | Oxh | b/q | poJ | zsB |
| (M{ | -o` | 8u+ | CJ{ | Oz! | bsr | pzr | \|#f |
| (O` | -q. | 8wb | CNk | Oz` | c#g | p\|j | \|)N |
| (W> | -z4 | 99x | Cxk | P:~ | c({ | qb/ | \|*t |
| (]; | -}( | 9>% | Czc | P>n | c)O | qr. | \|-) |
| (g= | .!w | 9F/ | Dk; | S:9 | c/a | s*G | \|Jr |
| (g\| | .-G | 9X; | Do+ | S:x | cCz | sR: | \|Lj |
| (o\ | .T> | 9^# | F:7 | S>) | cOJ | spj | \|cb |
| (ys | .d= | 9q+ | Fz3 | S>h | cS: | szB | }B. |
| (}c | .oP | 9v, | Fl+ | Sr+ | csb | t(~ | }b, |
| *1w | .qr | 9w( | G:' | V2> | d+7 | tc: | }c( |
| *=G | .}B | :!_ | GJ; | X8o | d-/ | v"7 | ~!N |
| *qs | /!g | :'G | GN+ | X:\| | d{2 | v,9 | ~"5 |
| *wp | /)G | :5x | Gx+ | X;9 | f,= | v,x | ~#F |
| *}C | /Az | :T; | Gz# | X>l | f/p | v.1 | ~-H |
| +lg | /Q: | :wB | LJ~ | X?) | g!/ | v.p | ~R2 |
| +9G | /qb | <'f | LNn | Xs+ | g(= | vr2 | ~cB |

The ASCII sequence "-z4" is shown in FIG. 2, where the byte corresponding with "-" includes "00101101", the byte corresponding with "z" includes "01111010", and the byte corresponding with "4" includes "00110100".

Figure 3A:
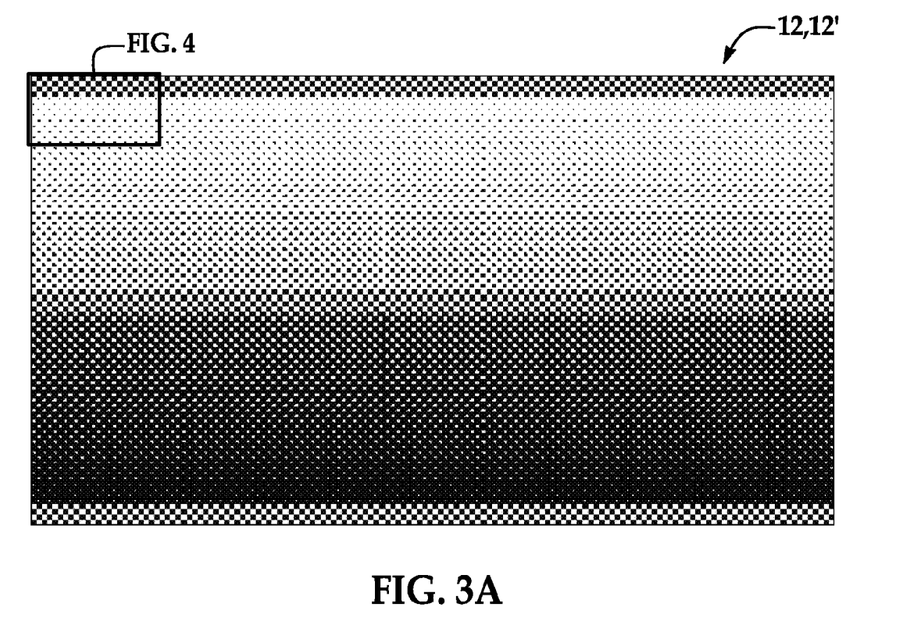
FIG. 3A is a schematic representation of a reference halftone.
Figure 5A:
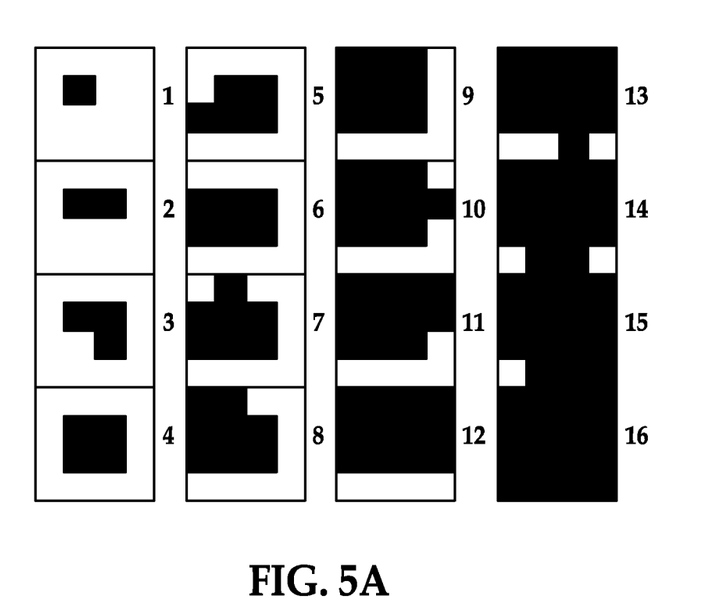
FIGS. 5A and 5B are schematic views of various highlight cells and shadow cells, respectively, with different symbol shapes.
Figure 5B:
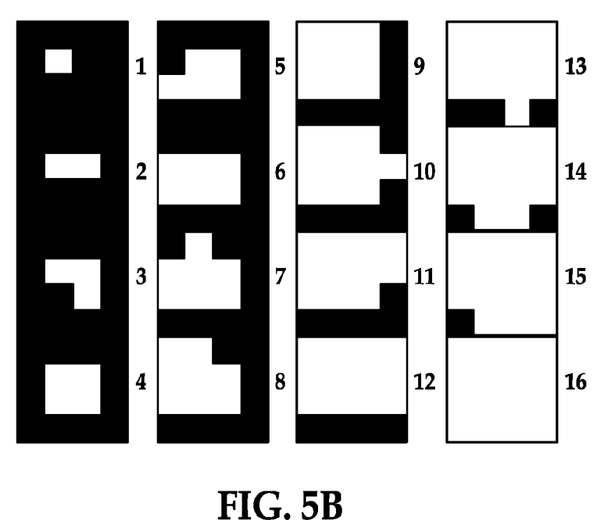

Referring back to FIG. 1, the comprehensive carrier configuration 12 is the uncoded arrangement of all possible information carriers in equal numbers, and is generated as a tool for use in combination with the parallel test payload 10 to assess the possible information carriers. The comprehensive carrier configuration 12 may be implemented using a variety of cells, which may be classified according to their type (e.g., non-carrier cell or carrier cell, where the carrier cell may be further classified by the number of bits that it may carry). Examples of suitable cells are shown in FIGS. 5A and 5B and are discussed further hereinbelow. The comprehensive carrier configuration 12 has a configuration that represents all possible codes that may be encoded therein/thereon. One example of a comprehensive carrier configuration 12 is shown in FIG. 3A. This comprehensive carrier configuration 12 is a reference halftone 12' formed from a comprehensive test image 20 (shown in FIG. 3B) having grey values that can uniformly test all possible codes. It is to be understood that the reference halftone 12' shown and described in FIG. 3A is a non-limiting example, and it is to be understood that any comprehensive carrier configuration 12 may be utilized, such as, for example a magnetic storage process where ferrite particles on a substrate are capable of holding varying numbers of bits (as opposed to conventional magnetic storage where all particles carry exactly 1 bit). In this other non-limiting example, the comprehensive carrier configuration would be manufactured so that the ferrite particle types (i.e., carrier and non-carrier particles) have an average density such that all codes are uniformly represented.

Figure 3B:
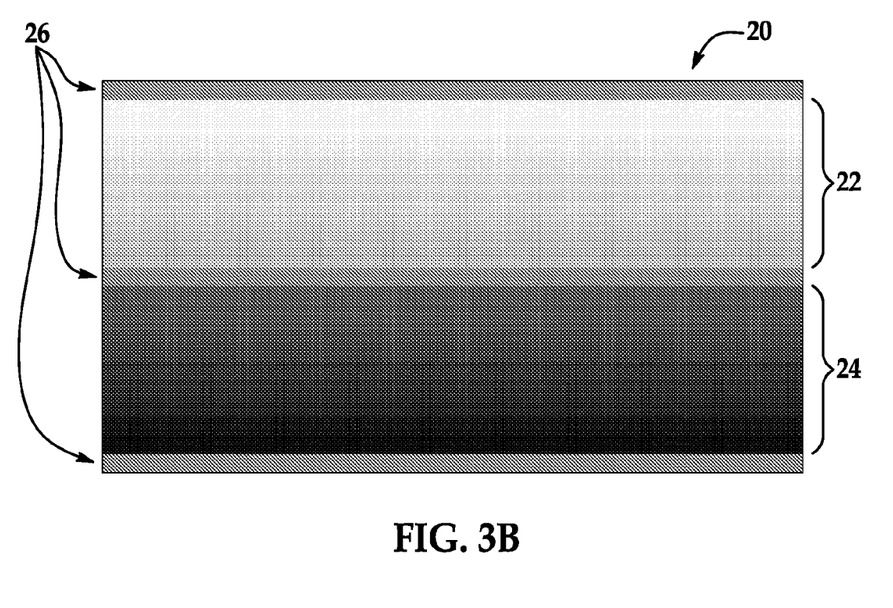
FIG. 3B is a schematic representation of a comprehensive test image used to generate the reference halftone of FIG. 3A.

The comprehensive test image 20 shown in FIG. 3B may be used to test data carriers in a steganographic halftone system (such as that described in U.S. patent application Ser. No. 12/563,432, entitled "System and Method for Creating a Data-Bearing Image" and filed on 21 Sep. 2009). The test image 20 is halftoned to generate the reference halftone (see, e.g., FIG. 3A). Halftoning refers to any process that creates the illusion of continuous tone images by judicious arrangement of binary picture elements, such as ink drops in the case of inkjet printers. Thus, halftoning is printing the simulation of a continuous-tone image, such as a shaded drawing or a photograph, with groups or clusters of color or black dots. Digital halftoning is sometimes called spatial dithering.

For a halftone system, particular input image values will result in the same halftone pattern or carrier throughout the comprehensive test image 20. The example shown in FIG. 3B has such values represented as constant bands of fixed pixel values. In this non-limiting example, the size of the bands is set so that an integer number of full halftone carriers will be produced in the reference halftone 12'. The size may also be set so that a sufficiently large number of each carrier will be generated.

As previously mentioned, it is to be understood that at least some of the cells will be data carrying cells. Non-data carrying cells may also be incorporated, for example, to delineate data areas or provide points of reference for properly aligning images. Generally, input image values may be analyzed according to a threshold template and selection rules to determine the location, size and number of data carrier cells in the resulting reference halftone 12'.

Figure 4:
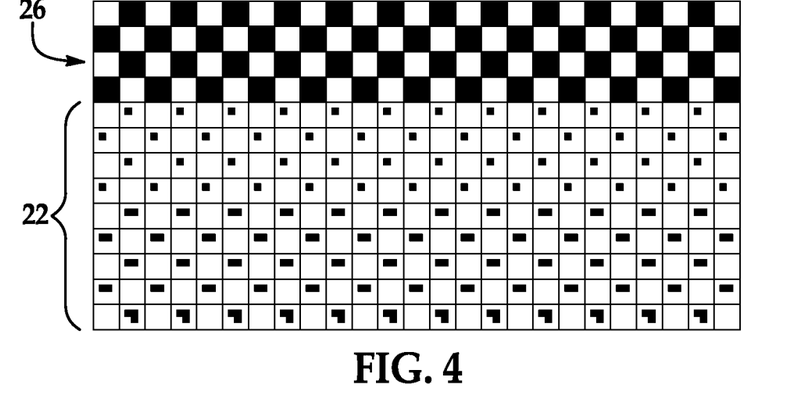
FIG. 4 is an enlarged view of the upper left hand corner of the reference halftone of FIG. 3A.

The cells of halftone images 12' may be one of two variations that are distinguishable at least by the spatial arrangement of pixel activation order. Shadow cells produce patterns that manifest as white clusters/symbols surrounded by black (i.e., pixels are activated centrally first then progressively toward the edges), and highlight cells manifest as black clusters/symbols surrounded by white (i.e., pixels are activated first on the edge and then progressively toward the center). When the comprehensive test image 20 is halftoned, the bars labeled 22 will halftone to bands of highlight cells of constant size, and the bars labeled 24 will halftone to shadow cells. To aid in recovery, the bars labeled 26 will halftone to checkerboard patterns to clearly define cell boundary markers. The cells making up the checkerboard pattern are non-carrier cells. As previously mentioned, the reference halftone 12' generated from the comprehensive test image 20 is shown in FIG. 3A. An enhanced schematic view of the upper left hand corner of the reference halftone 12' is shown in FIG. 4. This figure clearly illustrates the checkerboard pattern and the various highlight cells.

Figure 6:
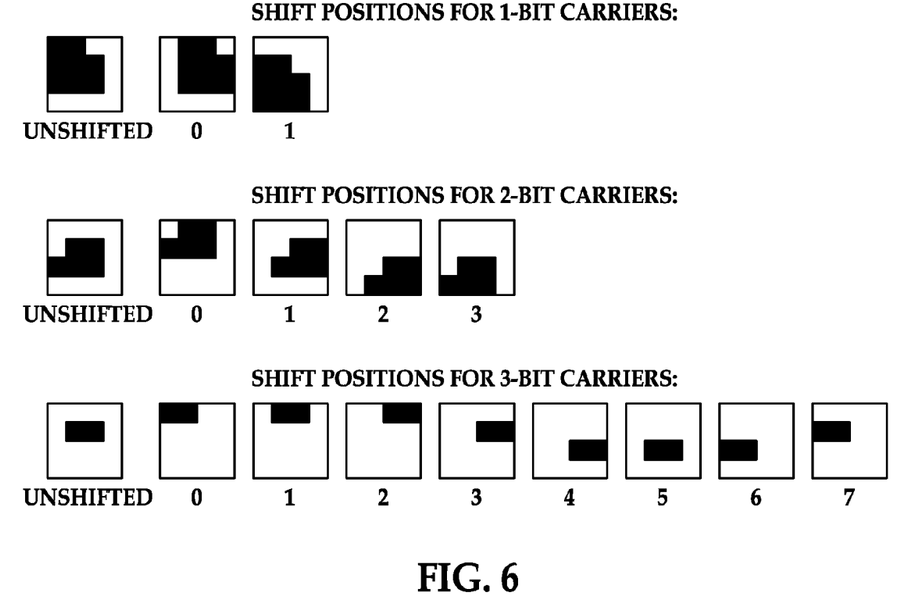
FIG. 6 is an example of shift positions for three different symbol shapes of highlight cells.

Following the description of halftone images in U.S. patent application Ser. No. 12/563,432, there are nine highlight and nine shadow carrier cell shapes. Carrier cells are those whose shape (i.e., the black or white cluster) can undergo at least two single pixel shifts, thereby enabling at least one bit of data to be encoded therein/thereon. It is to be understood that not all cluster shapes will afford the same degree of freedom to move. As illustrated in FIGS. 5A and 5B respectively, highlight and shadow cells 1 through 9 are potential carrier type cells. More available shift positions for a shape or cluster means that more bits can be encoded in the cell, as is illustrated in FIG. 6 for exemplary highlight cells. Referring back to FIGS. 5A and 5B, the cluster in cells 1, 2, 3, and 4 are able to move to all eight surrounding positions and can thus carry three bits; the cluster in cells 5 and 6 can move to five positions, four of which can be used to encode 2 bits; and the cluster in cells 7, 8 and 9 can move to three positions and thus can carry 1 bit. As illustrated in FIGS. 5A and 5B, the clusters in cells 10 through 16 may not undergo at least two single pixel shifts, and thus are designated non-carriers. The mapping of variable bit length codes to shift positions can be defined by any suitable shift rule (an example of which is discussed in U.S. patent application Ser. No. 12/563,432, referenced hereinabove).

A reference map (not shown) may be generated in order to properly assess the data capacity of the reference halftone 12'. Such a map is the product of analysis of the test image 20, including an inventory of available carrier cells. In this process, the test image 20 is flattened (i.e., segmented into cells and flattened so that each cell holds a single average value) and assessed using known carrier selection rules. More particularly, each cell is assessed based on its value to determine whether the resulting halftone cluster will exhibit a shape that is useful for encoding data when rendered by the candidate rendering system 30. As such, the system 100 may include a reference map generator (not shown), input to which can include the flattened carrier image and the carrier selection rules. By referring to a dither threshold array, the reference map generator first applies a halftone screen to the comprehensive test image 20, segmenting the image highlight cell and shadow cell regions. The reference map can then be populated according to the carrier selection rules (examples of which are provided in U.S. patent application Ser. No. 12/563,432). The information used to generate the reference map may also be used to provide a carrier count (i.e., the total bit capacity of all carrier cells in the image 20).

Knowing the bit sequence (code) and various bit lengths of the sub-sequences of the parallel test payload 10, and the rules for mapping variable bit length codes, enables the comprehensive carrier configuration 12 to be generated for the parallel test payload 10. In one embodiment, a computer program having suitable algorithms and software routines generate the comprehensive carrier configuration 12 based upon the bit sequence, the bit-lengths of the various sub-sequences, and the selected carrier selection rules. It is to be understood that the comprehensive test image 20 and corresponding reference halftone 12' disclosed herein is non-limiting, and that any comprehensive carrier configuration 12 may be designed that enables all possible carrier symbols/cells with all possible encoding shifts to be tested for all codes of the parallel test payload 10 being used.

Referring back to FIG. 1, a data embedding system 26 is used to impart data in the parallel test payload 10 onto the comprehensive carrier configuration 12 to create a digital composite signal 28. The encoding and embedding of the parallel test payload 10 onto the comprehensive carrier configuration 12 (e.g., reference halftone 12') may be accomplished by encoding the payload data into a pattern of cell shifts and executing those shifts on the reference halftone image 12'. The particular shifts constituting the code are specified by the shift rule(s). Accordingly, the data embedding system 26 may include a shift list generator that is configured to receive the reference map, shift rule(s), and parallel test payload 10 as inputs and break up the parallel test payload 10 into data segments whose number and sizes correspond to those of the selected carrier cells designated in the reference map. It is to be understood that the method for embedding the parallel test payload 10 disclosed herein is suitable for a reference halftone 12' comprehensive carrier configuration 12, and that embedding may be accomplished via other known methods if another comprehensive carrier configuration 12 is utilized.

Figure 7A:
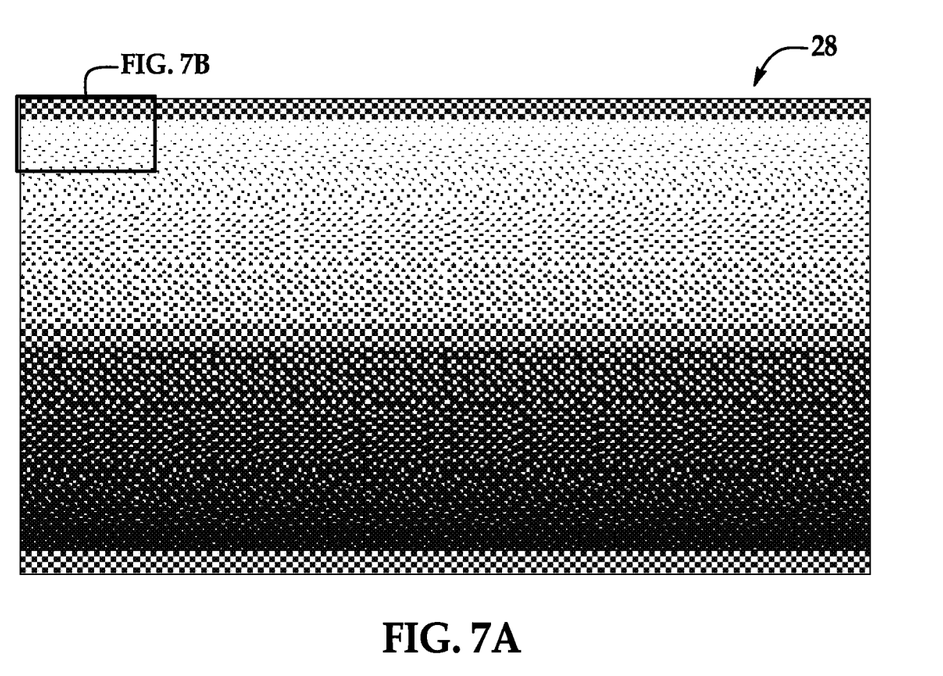
FIG. 7A is a schematic representation of a composite digital signal formed when the parallel test payload of FIG. 2 is implemented in the reference halftone of FIG. 3A.
Figure 7B:
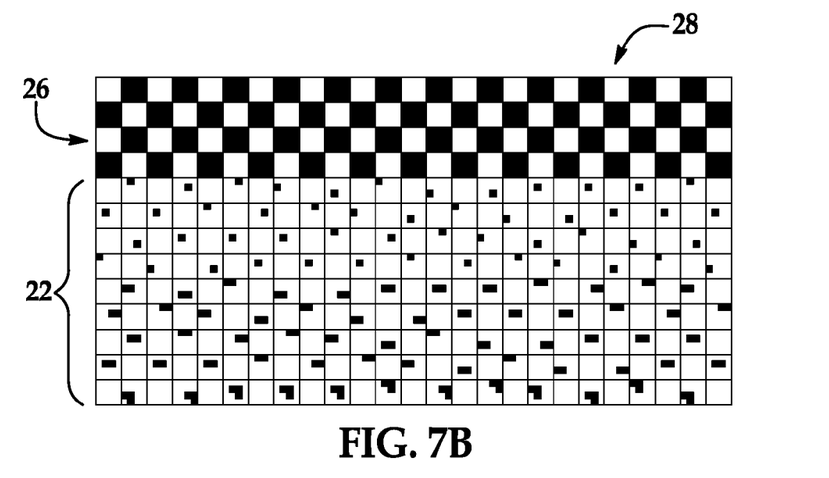
FIG. 7B is an enlarged view of the upper left hand corner of the composite digital signal of FIG. 7A.

A non-limiting example of the digital composite signal 28 is shown in FIG. 7A, and an exploded view of the upper left hand corner is shown in FIG. 7B. As illustrated in FIG. 7B, embedding the parallel test payload 10 into the comprehensive carrier configuration 12 shifts the clusters within carrier cells having data embedded therein/thereon. Such shifts can be seen by comparing FIGS. 4 and 7B. At least the checkerboard cells remain unshifted, as data is not incorporated therein. These particular non-carrier cells 26 aid in the location of the cell boundaries as indicated by the overlay of grid lines.

The composite digital signal 28 is then sent to the candidate rendering system 30 to be converted to analog form (e.g., magnetic oxide particles, electromagnetic signals, optically readable symbols, or ink) on some data-bearing media 32. The data-bearing media 32 may be a magnetic strip, a disk, a printing substrate (e.g., uncoated paper, coated paper, polymeric films, etc.). As such, any suitable candidate rendering system 30 capable of converting the digital composite signal 28 to the desired analog form on the selected media 32 may be used. As non-limiting examples, the candidate rendering system 30 may be a printer, a laser diode light, a laser etcher, or any other means of creating a readable, permanent or semi-permanent mark on a substrate (data-bearing medium 32) of interest.

Once the composite digital signal 28 is in analog form, an analog-to-digital capture system 34 may be used to read the analog signal and convert it back to a digital signal. The converted signal is referred to herein as the recovered composite signal 36. The analog-to-digital capture system 34 used will depend upon the analog form that is used. As non-limiting examples, the analog-to-digital capture system 34 may be a scanner, a disk reader (e.g., a DVD player, a BLURAY® disk player, etc.), a camera, a haptics sensor, or any other means of reading the analog carrier and recovering a digital signal therefrom.

The recovered composite signal 36 is transmitted to a data recovery system 38, which is configured to perform the inverse of the data embedding system 26 and extract a recovered payload 40 from the recovered composite signal 36. It is to be understood that the method of recovery will depend, at least in part, on the format in which the composite digital signal 28 is provided. While the discussion of recovery herein is directed to approaches typically used on print images, it is to be further understood that the principles discussed herein can be adapted to deal with other formats, such as digital files.

The steps involved in recovering and decoding data will be determined, at least in part, by the manipulations made in creating the reference halftone 12' and the composite digital signal 28. Therefore, in one embodiment, to facilitate recovery of certain information, such processes and outputs can be made available to the data recovery system 38. In order to enhance the system 100, it is to be understood that image 20 and halftone 12' generation, payload 10 data encoding, and recovery may be incorporated into a single device. More generally, the composite signal 28 can be input into the data recovery system 38, the carrier cells can be identified by referring to the reference map, and the payload encoded therein can be extracted. In one embodiment, the reference map is imported into the data recovery system 38 at the time of recovery. Alternatively, the reference map can be made available in a database including reference maps for a number of comprehensive carrier configurations 12.

In one embodiment, the data recovery system 38 refers to the reference map to ascertain the location of the carrier cells. Then, a comparing system 42 of, or operatively connected to, the data recovery system 38 can assess the position of each cluster in the cells of the recovered composite signal 36 as compared to the corresponding clusters in the cells in the composite signal 28. Where a difference of position is detected, the value of the shift direction can be ascertained by reference to the shift rule. In this manner, the data segments of the payload 10 can be decoded and reassembled to recover the payload 40. In another embodiment, after the analog carrier is scanned, the recovered composite signal 36 is aligned with the cell boundaries of the reference halftone 12'. The carrier cells of the recovered composite signal 36 are compared against the unshifted reference cells. Any shifts are noted and translated into code values. The resulting code values may then be compared with the code values of the composite signal 28.

Recovery of embedded code in a recovered composite signal 36 can be complicated by the approach used to scan and the limitations of the particular device. For example, scanning a printed image can raise a host of issues, arising both from the printer (e.g. dot gain, black-white non-linearities) and the scanning device (e.g., positioning, alignment, scaling, zooming). In addition, the presence of non-carrier (reference) cells may be used by the data recovery system 38 to calibrate the recovered composite signal 36 against the reference map and the reference halftone image 12'.

Furthermore, each of the cells of the recovered composite signal 36 may be classified as a particular type (i.e., carrier (1-bit, 2-bit, 3-bit carriers, etc. or non-carrier). This classification is compared with its intended value or classification (i.e., the carrier type assigned to a corresponding carrier cell in the composite signal 28).

The comparisons made allow for recovery statistics 46 to be generated. The recovery statistics may be used to tailor an encoding system for the particular candidate rendering system 30 used/tested. In the example used herein, the candidate rendering system 30 is one or more printers, which may have different resolutions and/or pixel replication settings. For a particular candidate rendering system 30, the results of correct and incorrect recovery of the originally embedded parallel test payload 10 directly impact the selection of the analog carrier used, the carrier cells and types used, and/or the associated error correction that may be needed or desirable. In particular, the recovery rates of the selected carrier cells/symbols enable payload redundancy for error correction to be efficiently designed.

The following measurements of classification accuracy (i.e., recovery statistics) may be computed via the comparing system 42: recall statistics; precision statistics; and/or accuracy statistics. Recall and precision are respectively determined by the following:

$$\text{Recall } (R) = \frac{(\text{number of carrier type } X \text{ correctly classified as } X)}{(\text{number of carrier type } X \text{ printed})}$$

$$\text{Precision } (P) = \frac{(\text{number of carrier type } X \text{ correctly classified as } X)}{(\text{number of carrier types classified as } X)}$$

Generally, $0.0 \leq R \leq 1.0$ and $0.0 \leq P \leq 1.0$. Recall increases as the percent of a given carrier type that is correctly classified increases (i.e., recall increases as false negatives decrease), while precision increases as the percent of all other carrier types incorrectly classified as the given type decreases (i.e., precision increases as false positives decrease). Accuracy is the geometric mean of R and P, or:

$$\text{Accuracy } (a) = 2PR/(P+R)$$

In general, accuracy is the single metric of comparison among the different carrier types (CT). Accuracy may be computed for every carrier type and then the carrier types may be ranked in some desirable order (e.g., from best (i.e., most accurate) to worst (i.e., least accurate)).

The carrier types having the highest accuracy may then be selected to provide the optimally robust carrier set for a subsequently given data carrying rate. This optical set ($\{CT\}_{optimal}$), is generally determined by determining the required payload density (as measured, for example, in bits/inch$^2$, bits/symbol, etc.), and determining the expected bit density, E(bd), provided for all L, where L=1, ..., N and N is the number of all possible carrier types, and E(bd) is defined as:

$$E(bd) = \sum_{i=1}^{L} bd(CT_i) * p(CT_i)$$

where $bd(CT_i)$ is the bit density of the i'th ranked carrier type and $p(CT_i)$ is the probability that the i'th carrier type will be printed in any given carrier cell.

It is to be understood that the probability is intrinsically image-dependent, although for most images the probability of each individual carrier type has an expected value of 1/N and halftoning carrier cell selection approaches may be configured to favor uniform probability or favor higher-ranked (more accurate) carrier types, depending, at least in part, on the required bit density, bd. Furthermore, the value of L is sufficiently large in order to accommodate the required bit density, bd.

The $\{CT\}_{optimal}$ set is defined as CT 1 ... L, and these are the carrier types that will carry data in the deployed system. The remaining carrier types (e.g., CTL+1, ..., N) are ignored. It is believed that this results in a deployed payload that has a relatively robust read accuracy, and potentially minimizes the need for error correction codes.

It is to be understood that the method and system 100 disclosed herein may be used to test a plurality of carriers (i.e., cells, symbols) in a single comprehensive carrier configurations 12 or in multiple configurations 12 (e.g., implemented in the form of a test sheet) with a candidate rendering system 30 at the same time. The system 100 disclosed herein may also be used to generate a data-bearing image that includes an entropic neighborhood. In such an image, each of the selected carriers for the associated payload has a desirable recovery rate, and thus the "neighborhood" of carriers deployed will be more reliable in terms of recovery.

While several embodiments have been described in detail, it will be apparent to those skilled in the art that the disclosed embodiments may be modified. Therefore, the foregoing description is to be considered exemplary rather than limiting.

What is claimed is:

1. A parallel test payload, comprising:
 a bit sequence configured to be segmented into a plurality of sub-sequences having variable bit length carriers; and
 each of the plurality of sub-sequences including:
  respective carriers represented uniformly in a respective sub-sequence such that each of the respective carriers is present an equal number of times in the respective sub-sequence; and
  a number of bits present in each of the respective carriers such that each of the respective carriers in the respective sub-sequence has a bit length that is different than a bit length of any other respective carriers in any other respective sub-sequences;
 wherein the bit sequence is represented in each of the plurality of sub-sequences through the respective carriers.

2. A parallel test payload, comprising:
 a bit sequence configured to be segmented into a plurality of sub-sequences having variable bit length carriers; and
 respective carriers represented uniformly in each one of the plurality of sub-sequences;
 wherein the bit sequence includes twenty four bits; and wherein the variable bit length carriers include a three-bit length carrier, a two-bit length carrier, and a one-bit length carrier.

3. The parallel test payload as defined in claim 2 wherein eight carriers of the bit sequence are represented once when the bit sequence is segmented into a sub-sequence having the three-bit length carriers; wherein four carriers of the bit sequence are represented three times when the bit sequence is segmented into a sub-sequence having the two-bit length carriers; and wherein each carrier of the bit sequence is represented equally when the bit sequence is segmented into a sub-sequence having the one-bit length carriers.

4. The parallel test payload as defined in claim 1 wherein the bit sequence is embedded in an analog carrier.

5. The parallel test payload as defined in claim 4 wherein the analog carrier is selected from particles on a magnetic strip, etchings burnt into a disk, or ink printed on a substrate.

6. The parallel test payload as defined in claim 1 wherein the bit sequence after segmentation is presentable as a printable ASCII sequence.

7. The parallel test payload as defined in claim 1 wherein a maximum value of the bit length of the respective carriers is five.

8. A method for generating a parallel test payload, comprising:
 generating a bit sequence; and
 segmenting the bit sequence into a plurality of sub-sequences having variable bit length carriers such that respective carriers are represented uniformly in each one of the plurality of sub-sequences and such that the bit sequence is represented in each of the plurality of sub-sequences through the respective carriers, the segmenting including:
  selecting a bit length for the respective carriers of a respective sub-sequence, the bit length for the respective carriers of the respective sub-sequence being different from a bit length for any other respective carriers in any other respective sub-sequences; and
  dividing the bit sequence such that a number of bits present in each of the respective carriers of the respective sub-sequence corresponds with the selected bit length, and such that the respective carriers are represented an equal number of times in the respective sub-sequence.

9. The method as defined in claim 8, further comprising embedding the parallel test payload into at least one analog carrier on a data-bearing medium.

10. A parallel calibration method, comprising:
 generating the parallel test payload of claim 1;
 embedding data of the parallel test payload onto a plurality of different carrier cells of a comprehensive carrier configuration, thereby generating a digital composite signal;
 converting the digital composite signal to analog form on a data-bearing medium;
 converting the analog signal to a recovered digital signal;
 performing an inverse embedding process to extract recovered data of the parallel test payload from the recovered digital signal; and
 generating recovery statistics by comparing the recovered data with the embedded data.

11. The method as defined in claim 10 wherein generating the parallel test payload is accomplished by:
  generating the bit sequence; and
  segmenting the bit sequence into the plurality of sub-sequences having the variable bit length carriers such that respective carriers are represented uniformly in each one of the plurality of sub-sequences, the segmenting including:
    selecting the bit length for the respective carriers of the respective sub-sequence; and
    dividing the bit sequence such that a number of bits present in each of the respective carriers of the respective sub-sequence corresponds with the selected bit length, and such that the respective carriers are represented an equal number of times in the respective sub-sequence.

12. The method as defined in claim 10, further comprising selecting two or more carrier cells from the plurality of carrier cells for deployment of a payload based upon the recovery statistics.

13. The method as defined in claim 12 wherein the generating of the recovery statistics includes:
  classifying the recovered data as a carrier type;
  comparing the carrier type of the recovered data with a carrier type previously assigned to the embedded data; and
  from the comparison, determining at least one of recall statistics, precision statistics, or accuracy statistics.

14. The method as defined in claim 12, further comprising using a recovery rate of each of the two or more carrier cells selected to design payload redundancy for error correction.

15. A method for generating a parallel test payload, comprising:
  generating a bit sequence; and
  segmenting the bit sequence into a plurality of sub-sequences having variable bit length carriers such that respective carriers are represented uniformly in each one of the plurality of sub-sequences;
  wherein the bit sequence includes twenty four bits; and
  wherein the variable bit length carriers include a three-bit length carrier, a two-bit length carrier, and a one-bit length carrier.

16. The method as defined in claim 15 wherein eight carriers of the bit sequence are represented once when the bit sequence is segmented into a sub-sequences having the three-bit length carriers; wherein four carriers of the bit sequence are represented three times when the bit sequence is segmented into a sub-sequences having the two-bit length carriers; and wherein each carrier of the bit sequence is represented equally when the bit sequence is segmented into a sub-sequences having the one-bit length carriers.

* * * * *